(12) United States Patent
Liu

(10) Patent No.: US 7,675,446 B2
(45) Date of Patent: Mar. 9, 2010

(54) FILTER APPLIED IN SIGMA-DELTA MODULATOR AND FILTERING METHOD THEREOF

(75) Inventor: Chang Shun Liu, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 28 days.

(21) Appl. No.: 12/032,527

(22) Filed: Feb. 15, 2008

(65) Prior Publication Data
US 2008/0198052 A1      Aug. 21, 2008

(30) Foreign Application Priority Data
Feb. 15, 2007   (TW) .............................. 96105602 A (51) Int. Cl.
*H03M 1/66* (2006.01)
(52) U.S. Cl. ...................... 341/143; 341/188; 341/120; 341/155; 341/172
(58) Field of Classification Search ......... 341/118–122, 341/143, 155, 172
See application file for complete search history.

(56) References Cited
U.S. PATENT DOCUMENTS

| | | | | |
|---|---|---|---|---|
| 5,055,846 A * | 10/1991 | Welland | .................... | 341/155 |
| 5,719,573 A * | 2/1998 | Leung et al. | ................ | 341/143 |
| 6,492,924 B2 * | 12/2002 | Copley et al. | ............... | 341/139 |
| 6,590,372 B1 * | 7/2003 | Wiles, Jr. | ..................... | 323/316 |
| 6,822,592 B2 * | 11/2004 | Gandolfi et al. | ............ | 341/143 |
| 7,098,827 B2 * | 8/2006 | Motz | .......................... | 341/143 |
| 7,123,177 B2 * | 10/2006 | Cheng et al. | ................ | 341/143 |
| 7,295,143 B2 * | 11/2007 | Ambo et al. | ................. | 341/172 |
| 7,355,539 B2 * | 4/2008 | Petersen et al. | ............ | 341/143 |
| 7,375,666 B2 * | 5/2008 | Melanson | ................... | 341/143 |
| 7,532,138 B2 * | 5/2009 | Akizuki et al. | ............. | 341/143 |
| 2005/0275575 A1 * | 12/2005 | Motz | .......................... | 341/143 |
| 2006/0092059 A1 * | 5/2006 | Guimaraes | .................. | 341/143 |
| 2007/0080843 A1 * | 4/2007 | Lee et al. | .................... | 341/155 |
| 2007/0216557 A1 * | 9/2007 | Ebner et al. | ................. | 341/143 |

* cited by examiner

*Primary Examiner*—Linh V Nguyen
(74) *Attorney, Agent, or Firm*—Quintero Law Office (57) ABSTRACT

A filter applied in a sigma-delta modulator includes an integrator, a signal attenuator and a feedback circuit, in which these components are connected in series sequentially to form a local feedback circuit. The integrator integrates an input signal to output an integral signal. Accordingly, the signal attenuator attenuates the integral signal to output an attenuation signal to the local feedback circuit so as to share a part of attenuation amount to reduce the chip area of the sigma-delta modulator.

20 Claims, 7 Drawing Sheets

FILTER APPLIED IN SIGMA-DELTA MODULATOR AND FILTERING METHOD THEREOF

CROSS-REFERENCES TO RELATED APPLICATIONS

This non-provisional application claims priority under 35 U.S.C. §119(a) on Patent Application No(s). 096105602 filed in Taiwan, R.O.C. on Feb. 15, 2007, the entire contents of which are hereby incorporated by reference.

FIELD OF THE INVENTION

The present invention relates to a filter, and more particularly to a filter applied in a sigma-delta modulator.

BACKGROUND OF THE INVENTION

Analog-to-digital converter (ADC) is usually applied to the front ends of many signal processing schemes to convert an analog signal to a digital signal. Sigma-delta modulator, one kind of analog-to-digital converter, has being broadly applied in a high resolution data conversion technology; main skill used in the sigma-delta modulator for obtaining high resolution are over-sampling, noise shaping and filtering. Furthermore, the technology has successfully applied to direct current measurement, voice frequency and sound frequency signal processing, integrated service digital network (ISDN) and communication system.

Figure 1:
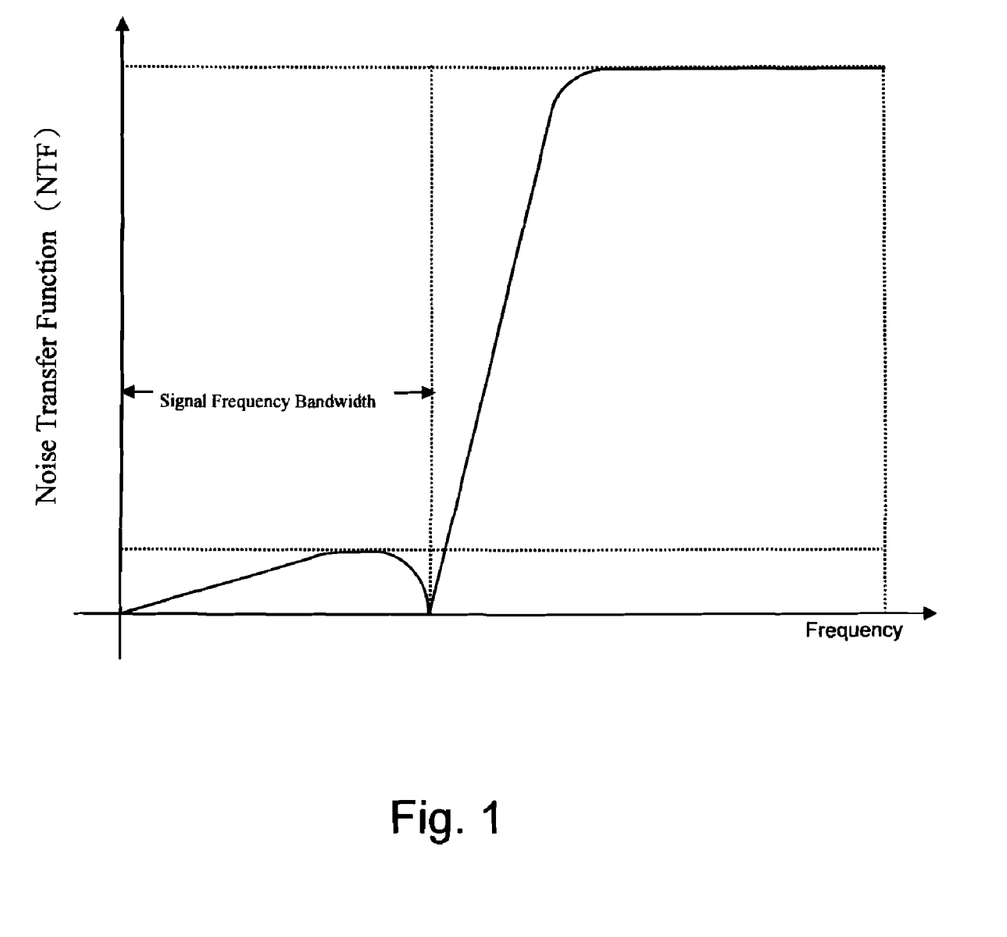
FIG. 1 is a graph of a noise transfer function (NTF) spectrum of a conventional sigma-delta modulator.

In general, summation circuit, filter, quantizer, and digital-to-analog converter (DAC) are included in the sigma-delta modulator, in which the filter may be implemented by a switched-capacitor integrator for filtering signals to increase a signal-to-noise ratio (SNR) of the sigma-delta modulator. Besides, feedback path in the filter can allow a conjugate zero being generated on a noise transfer function (NTF) spectrum of the sigma-delta modulator, as shown in FIG. 1. The conjugate zero can extend a plain scope of a signal frequency band and further suppress quantified noise in the signal frequency band.

However, when the sigma-delta modulator is applied to a voice signal product, an over-sampling ratio (OSR) is 64 or larger such that a product of a gain and an integral value of the local feedback will be very small, such as 0.002. If it is implemented by the switched-capacitor integrator, the product of the gain and the integral value of the local feedback must be equal to a value obtained by dividing a capacitance value of the feedback capacitor connected onto the feedback route with a capacitance value of an integrating capacitor. But, the capacitance value of the integrating capacitor will become very large under a condition that the feedback capacitor cannot be too small such that the area, the cost and a stray capacitance value at an output end of an operation amplifier increase.

SUMMARY OF THE INVENTION

For improving the deficits mentioned above, one of object of the present invention is to provide a filter applied in a sigma-delta modulator, reducing a capacitance value needed for a capacitor in a switched-capacitor integrator by means of signal attenuation.

One object of the present invention is to provide a filter applied in a sigma-delta modulator, generating a conjugate zero on a noise transfer function spectrum so as to extend a plain scope of a signal frequency band.

One object of the present invention is to provide a filter applied in a sigma-delta modulator, saving the area and the cost in an integrated circuit.

One object of the present invention is to provide a filter applied in a sigma-delta modulator, increasing modulator modulus choosing flexibility under a condition that the circuit efficiency is not influenced at all.

For attaining the objects mentioned above, one preferred embodiment of the present invention discloses a filter applied in a sigma-delta modulator. The filter includes: an integrator, for integrating an input signal to output an integral signal; a signal attenuator, coupled to the integrator, for attenuating the integral signal to output an attenuation signal through a voltage dividing resistor; and a feedback circuit, coupled between the signal attenuator and integrator, for feeding the attenuation signal back to the integrator; wherein, an amplitude of the attenuation signal is smaller than an amplitude of the integral signal.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 2:
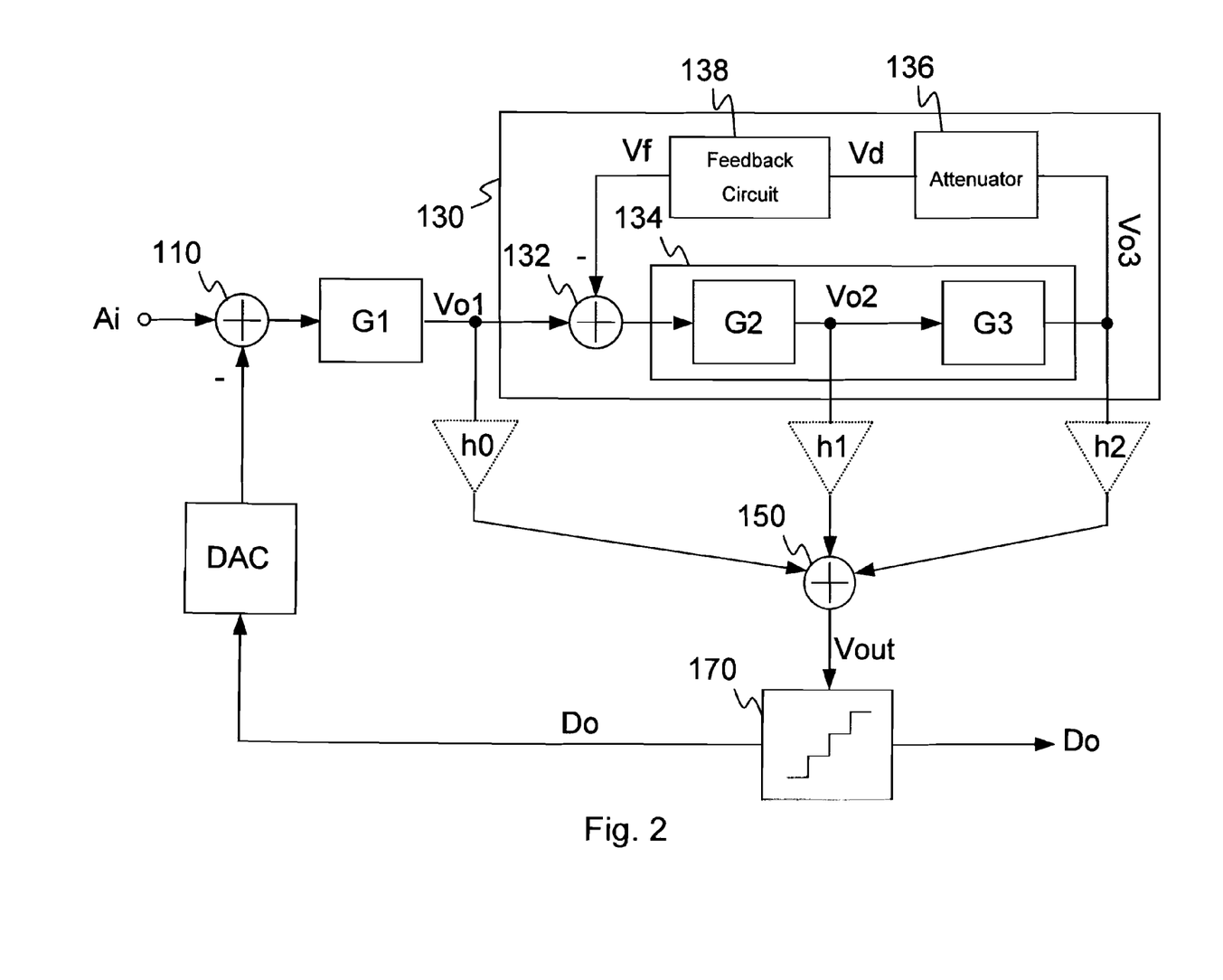
FIG. 2 is a schematic block diagram, showing a sigma-delta modulator according to a first embodiment of the present invention.
Figure 3:
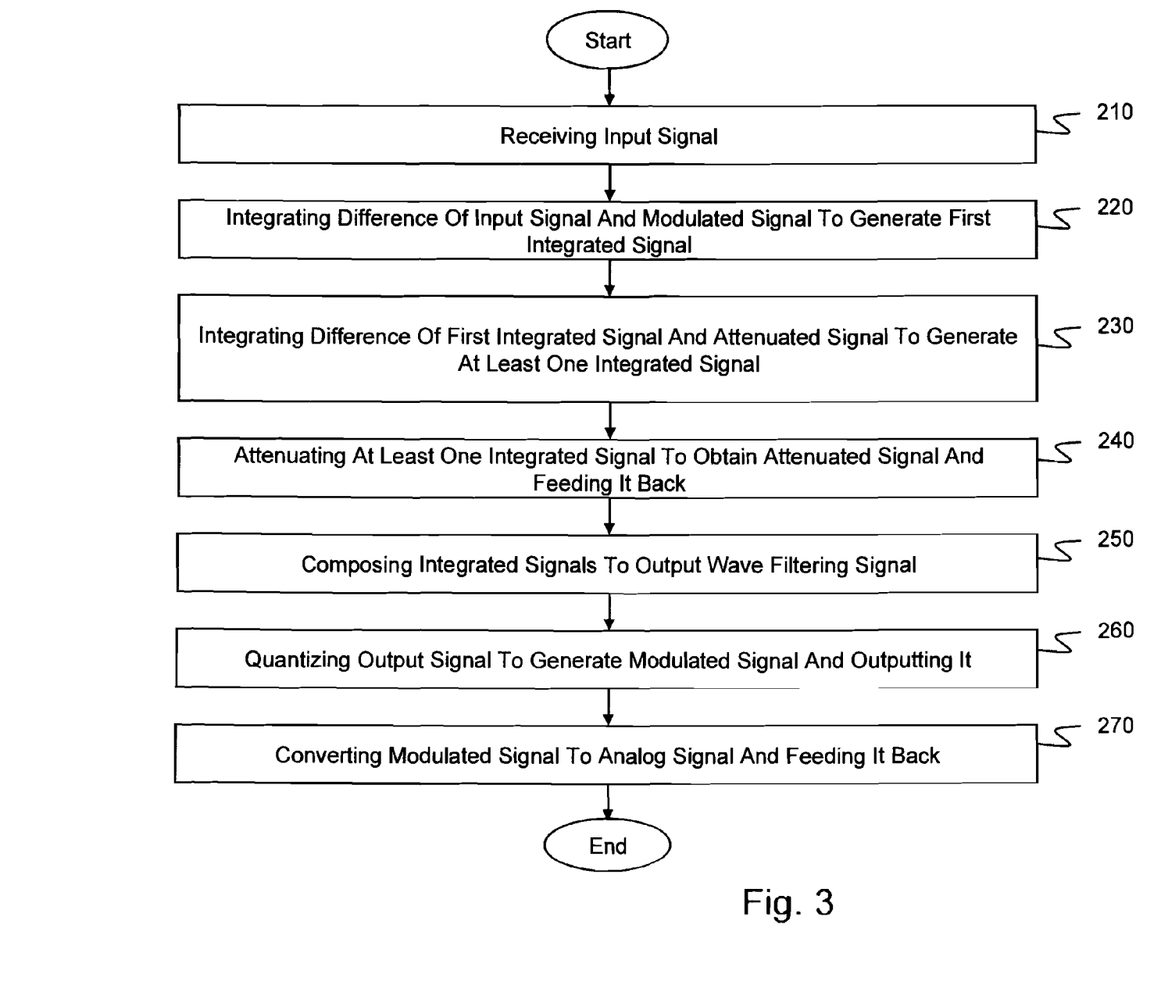
FIG. 3 is a flow chart, showing a sigma-delta modulation method according to one preferred embodiment of the present invention.

Please refer to FIG. 2 and FIG. 3. FIG. 2 and FIG. 3 respectively show a sigma-delta modulator and a sigma-delta modulation method of according to one preferred embodiment of the present invention. The sigma-delta modulator includes a first operation unit 110, a first integrating circuit G1, a filter 130, a quantizer 170 and a digital-to-analog converter unit DAC, in which the first operation unit 110, the first integrating circuit G1, the filter 130, the quantizer 170 and the digital-to-analog converter unit DAC form a feedback loop.

According to one preferred embodiment of the present invention, filter 130 includes a second operation unit 132, an integrator 134, a signal attenuator 136 and a feedback circuit 138, in which these elements form a local feedback loop as shown in FIG. 2. Besides, the first integrating circuit G1 may be disposed outside the filter 130 or included in the integrator 134.

The input end of the sigma-delta modulator receives an analog signal Ai (Step 210). Accordingly, the first operation unit 110 sums up the input signal Ai and a negative modulated signal outputted from the digital-to-analog converter unit DAC to generate a first operating signal. And then, the first integrating circuit G1 integrates the first operating signal (i.e. a difference between the input signal Ai and the modulated signal) to generate a first integral signal Vo1 (Step 220).

Accordingly, the second operation unit 132 perform a summation operation to the first integral signal Vo1 and a negative feedback signal Vf fed back from the feedback circuit 138 to generate a second operating signal (i.e. a difference between the first operating signal Vo1 and a feedback signal Vf).

Generally, the integrator 134 may includes one integrating circuit or n numbers of integrating circuit in series (n is greater than 1) for integrating a signal input from a previous stage to output an integral signal; according to one preferred embodiment of the present invention, the integrator 134 includes two integrating circuits G2 and G3, in which the second integrating circuit G2 integrates the second operating signal to generate a second integral signal Vo2, and the third integrating circuit G3 integrates the second integral signal Vo2 to generate a third integral signal Vo3 (Step 230). It is to be noticed that the number of the integrating circuits may be changed depend on design requirement; present invention is not only limited to two integrating circuits.

According to the present invention, the third integral signal Vo3 is attenuated to generate an attenuation signal Vd through the signal attenuator 136 and feed the attenuation signal Vd back to an input end of the second operation unit 132 through the feedback circuit 138 (Step 240).

As shown in FIG. 2, each output end of integrating circuits may be coupled to operation unit 150 so as to allow all of the integrating circuit outputs to be summed up. In other words, input ends of the operation unit 150 is respectively coupled to an output end of the first integrating circuit G1, an output end of the second integrating circuit G2 and an output end of the third integrating circuit G3 to output a wave filtering signal Vout (Step 250). However, the gain of the integral signals outputted from the integrating circuits G1, G2 and G3 could also be adjusted by gain adjusting unit h0, h1 and h2, and the adjusted integral signal is then outputted to the operation unit 150 to perform a summation operation. Besides, the operation unit 150 may be disposed outside the filter 130 or inside the filter 130.

Furthermore, digital modulated signal Do is generated after the wave filtering signal Vout is quantized through the quantizer (Step 260). And the modulated signal Do is fed back to the first operation unit 110 through the digital-to-analog converter unit DAC. That is, the modulated signal Do is converted to an analog signal through the digital-to-analog converter unit DAC and returned to the first operation unit 110 by a negative feedback (Step 270).

Figure 4:
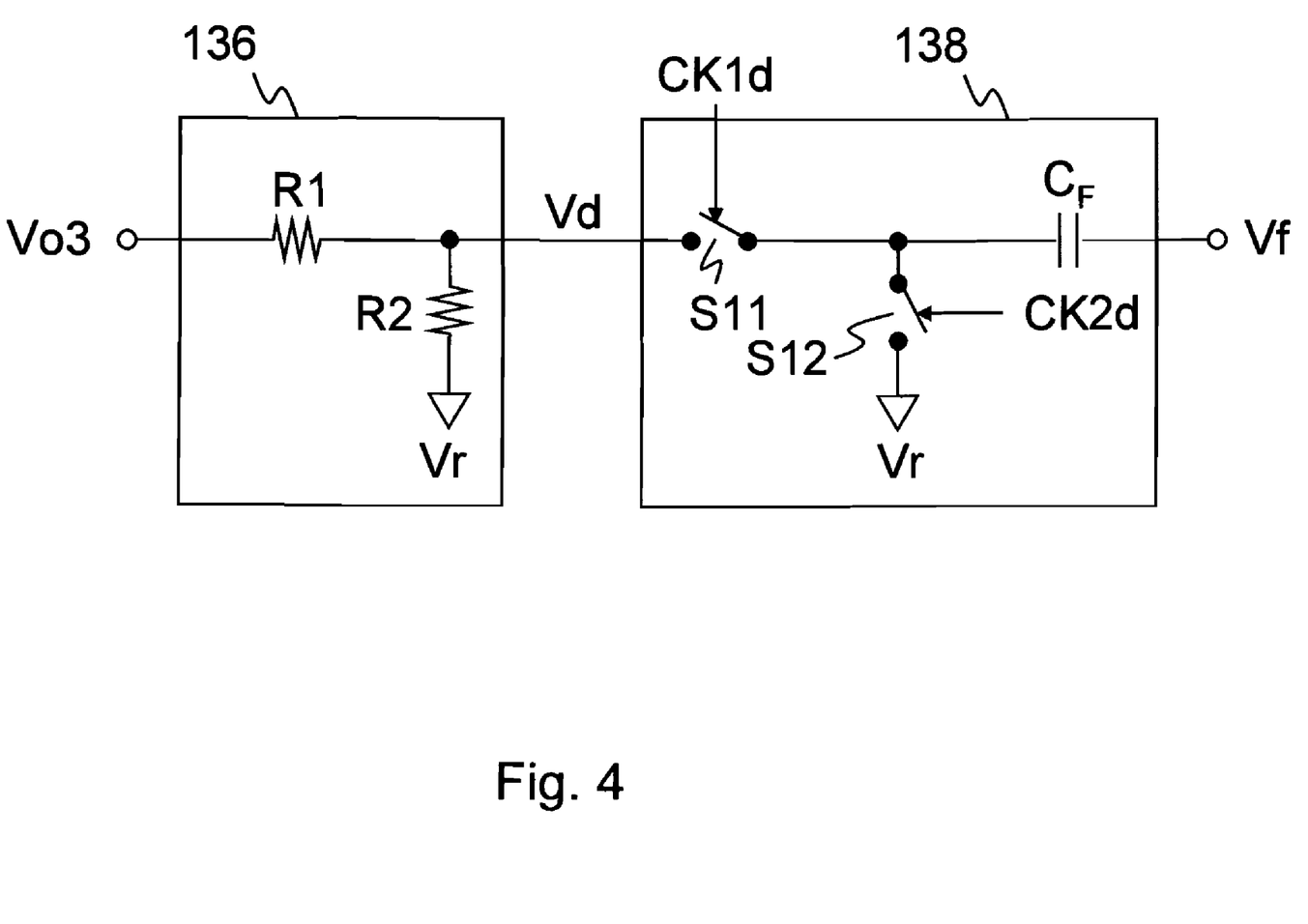
FIG. 4 is a block diagram, showing a signal attenuator and a local feedback circuit of a sigma-delta modulator according to one preferred embodiment of the present invention.

Please refer to FIG. 4. FIG. 4 shows signal attenuator 136 and feedback circuit 138 of sigma-delta modulator according to one preferred embodiment of the present invention. As shown in FIG. 4, feedback circuit 138 is a switched-capacitor circuit implemented by a plurality of switches S11, S12 and a feedback capacitor $C_F$. The feedback capacitor $C_F$ is coupled to the signal attenuator 136 through the switch S11. The switch S12 is coupled between reference voltage Vr and feedback capacitor $C_F$. The feedback circuit 138 is implemented depend on a plurality of control or pulse signals CK1d, CK2d with different phase. The control signals CK1d, CK2d are approximately inverted signals to each other such that the switch S11 is turned-on when the switch unit S12 is turned off and the switch S11 is turned-off when the switch S12 is turned-on. At the time of switch S11 is turned-on and switch S12 is turned-off, feedback capacitor $C_F$ is charged by attenuation signal Vd. Similarly, at the time of switch S11 is turned-off and switch S12 is turned-on, feedback capacitor $C_F$ is discharged through switch S12.

According to a preferred embodiment of the present invention, signal attenuator 136 is implemented by resistors R1 and R2, in which resistor R1 is coupled between feedback circuit 138 and third integrating circuit G3; and resistor R2 is coupled to the resistor R1 in series. Resistors R1 and R2 divide the voltage of third integral signal Vo3 outputted from the third integrating circuit G3 to implement a potential difference exist between output attenuation signal Vd and third integral signal Vo3. In other words, the amplitude of the attenuation signal Vd outputted by signal attenuator 136 is smaller than the amplitude of the third integral signal Vo3 outputted by third integrating circuit G3). As the structure shown in FIG. 4, the resistors R1 and R2 attenuate the third integral signal Vo3 to be K times, in which K=(R1+R2)/R2. Besides, resistors R1 and R2 may be implemented by a metal resistor, poly resistor or well-resistor. It is noticed that signal attenuator 136 implemented by resistors R1 and R2 is just an embodiment; other devices capable of attenuating signal are also belong to the scope of the present invention.

Figure 5A:
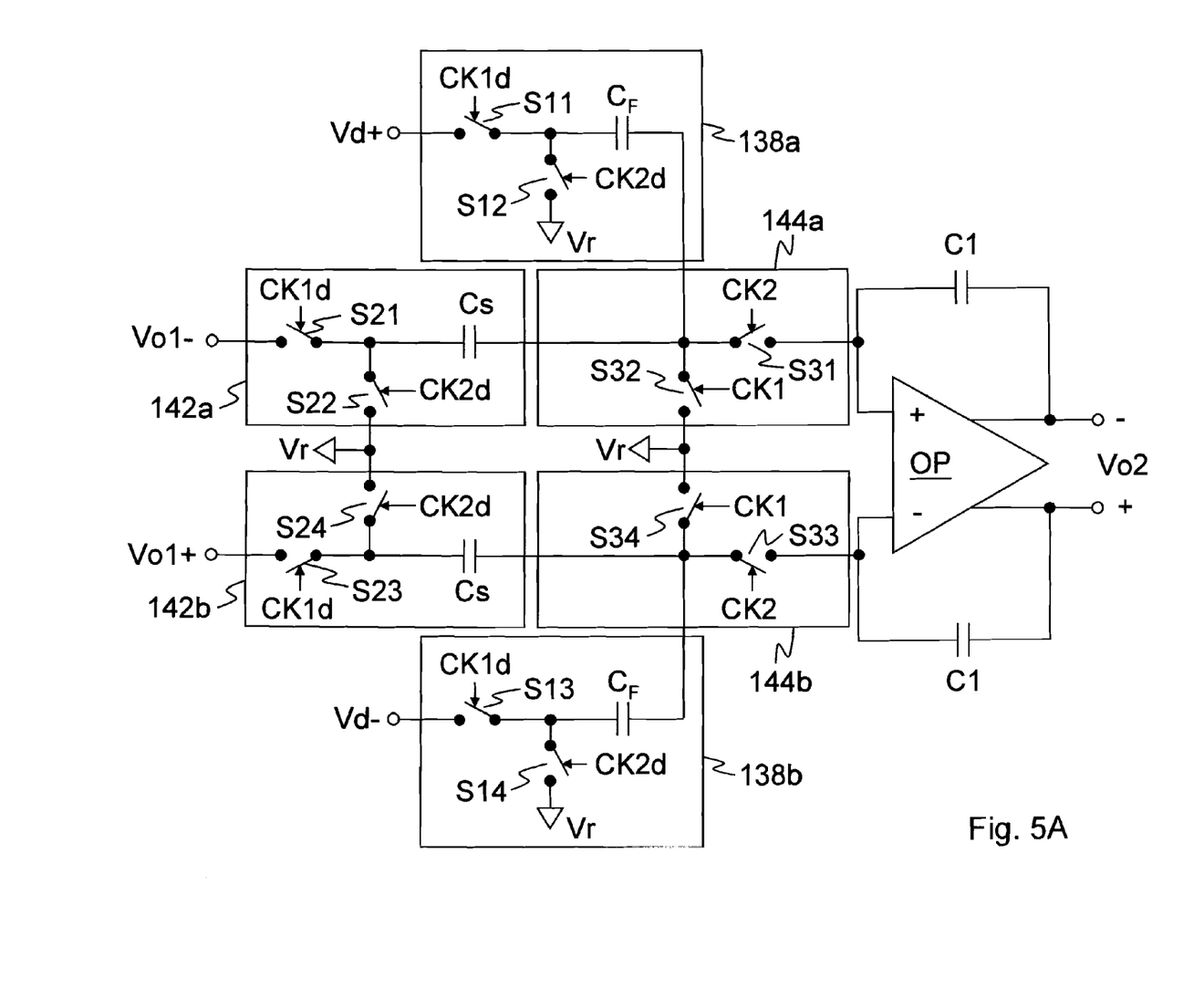
FIG. 5A is a block diagram, showing an integrator in a sigma-delta modulator according to one preferred embodiment of the present invention.

Please refer to FIG. 5A. FIG. 5A is a block diagram showing an integrating circuit according to one embodiment of present invention. The integrating circuit includes an operational amplifier OP, integrating capacitor C1, switch 144a, 144b and switched-capacitor 142a, 142b. As shown in FIG. 5A, integrating capacitor C1 is coupled between one input end and one output end of the operational amplifier OP; switch 144a/144b is coupled between switched-capacitor 142a/142b and one input end of operational amplifier OP. One end of the first switched-capacitor 138a/138b is coupled to switched-capacitor 142a/142b and switch 144a/144b. Furthermore, in the preferred embodiment, second operational unit 132 shown in FIG. 2 is implemented by switched-capacitor 138a/138b and switched-capacitor 142a/142b.

Figure 5B:
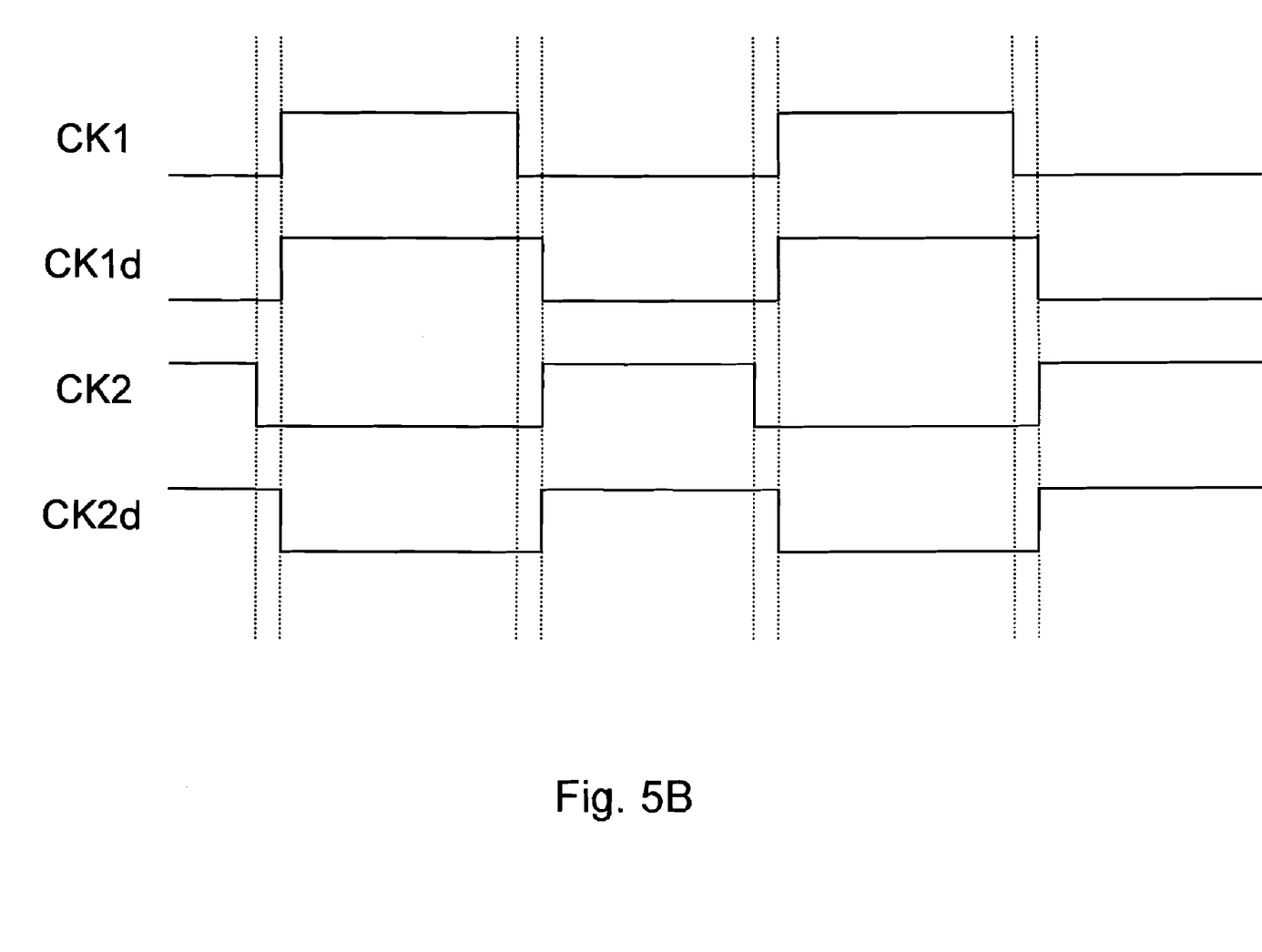
FIG. 5B is a graph, showing a time diagram of a control signal of the integrator shown in FIG. 5A.

Switches S11, S12, S13, S14, S21, S22, S23, S24, S31, S32, S33 and S34 are controlled by a plurality of control signals CK1d, CK2d, CK1 and CK2 with different phase. Control signals CK1d and CK2d are approximately inverted signals to each other, and the control signals CK1 and CK2 are approximately inverted signals to each other. Furthermore, the phase difference exists between the control signals CK1 and CK1d, and the phase difference exists between the control signals CK2 and CK2d are shown in FIG. 5B. Thus, the switches S11, S13, S21, S23, S32 and S34 are turned-on when the switches S12, S14, S22, S24, S31 and S33 are turned-off. At this period, the feedback capacitor $C_F$ and the energy storage capacitor Cs are respectively charged by the attenuation signal Vd and first integral signal Vo1. Similarly, the switches S11, S13, S21, S23, S32 and S34 are turned-off when the switches S12, S14, S22, S24, S31 and S33 are turned-on. At this period, the feedback capacitor $C_F$ and the energy storage capacitor Cs are discharged. According to one embodiment of the present invention, capacitance values of the energy storage capacitor Cs and the feedback capacitor $C_F$ are different That is, the capacitance values of switched-capacitor 138a/138b and switched-capacitor 142a/142b are different. Although integrating circuit is described in differential mode, but it is not limited to the present invention; integrating circuit could be implemented to single-ended mode depend on the design requirement. While the single-ended integrating circuit is implemented to single-ended mode, the negative input end of the operational amplifier OP is coupled to the reference voltage Vr and the positive input end is still coupled to switch 144a.

Figure 6:
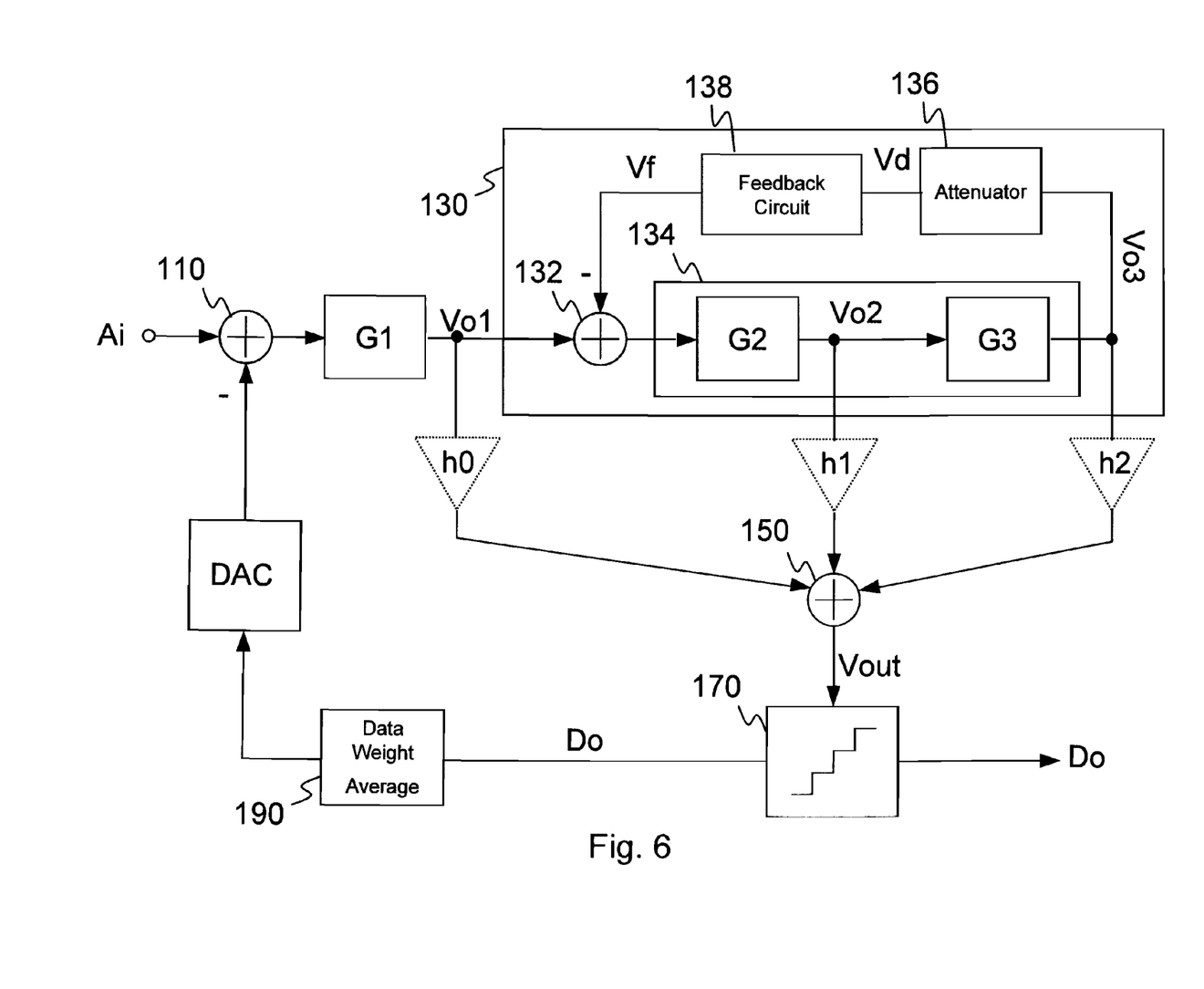
FIG. 6 is a block diagram, showing a sigma-delta modulator according to second embodiment of the present invention.

Please refer to FIG. 6, which shows a sigma-delta modulator according to second embodiment of the present invention. The difference between second embodiment shown in FIG. 6 and first the embodiment shown in FIG. 2 is data weight average (DWA). DWA in the second embodiment of the present invention is coupled between the quantizer 170 and the digital-to-analog converter unit DAC.

From the description mentioned above, it is realized that a conjugate zero is generated on a noise transfer function spectrum through the local feedback scheme so as to extend the plain range of a signal band and suppress the quantized noise in the signal band. Furthermore, a local feedback signal is attenuated to k times before the feedback circuit 138 by a signal attenuator 136 to share a part of attenuation amount of the product of a feedback gain ($g_f$, the gain of feedback circuit 138) and an integral value ($g_2$, the gain of integrating circuit G2). That is, $C_F/C1 = K \cdot g_f \cdot g_2$. Therefore, with adding the signal attenuator 136 before the feedback circuit 138, the capacitance values of the feedback capacitor $C_F$ and the integrating capacitor C1 can get closer so as to reduce the capacitor area and increase the flexibility of choosing modulating coefficient.

Furthermore, if the process of integrated circuit is implemented by metal-insulator-metal (MIM) capacitor process, the resistors used in signal attenuator 136 may be placed under the MIM capacitor. Thus, the resistors used in signal attenuator 136 will not occupy the integrated circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A filter, comprising:
   an integrator, for integrating an input signal to output an integral signal;
   a signal attenuator, coupled to the integrator, for attenuating the integral signal to output an attenuation signal; and
   a switched-capacitor, coupled between the signal attenuator and the integrator, for feeding back the attenuation signal to the integrator;
   wherein an amplitude of the attenuation signal is smaller than an amplitude of the integral signal, and wherein the integrator comprises:
      an operational amplifier, having an input end and an output end;
      an integrating capacitor, having a first end and a second end, the first end of the integrating capacitor is coupled to the input end of the operational amplifier and the second end of the integrating capacitor is coupled to the output end of the operational amplifier;
      a switching circuit, having a first end and a second end, the second end of the switching circuit is coupled to the first end of the integrating capacitor and the input end of the operational amplifier; and
      a second switched-capacitor, having a first end and a second end, the second end of the second switched-capacitor is coupled to the first end of the switching circuit and the first end of the second switched-capacitor is coupled to the input signal, and the switched-capacitor is coupled to the second end of the second switched-capacitor and the first end of the switching circuit.

2. The filter according to claim 1, wherein the signal attenuator is implemented by a resistor.

3. The filter according to claim 2, wherein the resistor is a metal resistor, a poly resistor or a well-resistor.

4. The filter according to claim 1, wherein the switched-capacitor is operated according to a plurality of pulse signals with different phase.

5. The filter according to 1, wherein the filter is applied in a sigma-delta modulator.

6. A filter, comprising:
   a integrator, comprising:
      a first integrating circuit, for integrating an input signal to output a first integral signal; and
      second integrating circuit, for integrating the first integral signal to output a second integral signal;
   a signal attenuator, coupled to the integrator, for attenuating the second integral signal to output an attenuation signal;
   a switched-capacitor, coupled between the signal attenuator and the integrator, for feeding back the attenuation signal to the integrator;
   wherein the first integrating circuit comprises:
      an operational amplifier, having an input end and an output end;
      an integrating capacitor, having a first end and a second end, the first end of the integrating capacitor is coupled to the input end of the operational amplifier and the second end of the integrating capacitor is coupled to the output end of the operational amplifier;
      a switching circuit, having a first end and a second end, the second end of the switching circuit is coupled to the first end of the integrating capacitor and the input end of the operational amplifier; and
      a second switched-capacitor, having a first end and a second end, the second end of the second switched-capacitor is coupled to the first end of the switching circuit and the first end of the second switched-capacitor is coupled to the input signal, and the switched-capacitor is coupled to the second end of the second switched-capacitor and the first end of the switching circuit.

7. The filter according to claim 6, wherein the signal attenuator is implemented by a resistor.

8. The filter according to claim 7, wherein the resistor is a metal resistor, a poly resistor or a well-resistor.

9. The filter according to claim 6, wherein the switched-capacitor is operated according to a plurality of pulse signals with different phase.

10. The filter according to claim 6, wherein the filter is applied in a sigma-delta modulator.

11. A filter, comprising:
    an integrator, for integrating an input signal to output an integral signal;
    a signal attenuator, coupled to the integrator, for attenuating the integral signal to output an attenuation signal; and
    a switched-capacitor, coupled between the signal attenuator and the integrator, for feeding back the attenuation signal to the integrator;
    wherein an amplitude of the attenuation signal is smaller than an amplitude of the integral signal, and wherein the integrator comprises:
       an operational amplifier, having an input end and an output end;
       an integrating capacitor, having a first end and a second end, the first end of the integrating capacitor is coupled to the input end of the operational amplifier and the second end of the integrating capacitor is coupled to the output end of the operational amplifier;
       a switching circuit, having a first end and a second end, the second end of the switching circuit is coupled to the first end of the integrating capacitor and the input end of the operational amplifier; and a second switched-capacitor, having a first end and a second end, the second end of the second switched-capacitor is coupled to the first end of the switching circuit and the first end of the second switched-capacitor is coupled to the input signal, wherein a ratio of a capacitance value of the integrating capacitor and a capacitance value of the switched-capacitor is corresponding to the attenuation signal.

12. The filter according to claim 11, wherein the signal attenuator is implemented by a resistor.

13. The filter according to claim 12, wherein the resistor is a metal resistor, a poly resistor or a well-resistor.

14. The filter according to claim 11, wherein the switched-capacitor is operated according to a plurality of pulse signals with different phase.

15. The filter according to 11, wherein the filter is applied in a sigma-delta modulator.

16. A filter, comprising:
   a integrator, comprising:
      a first integrating circuit, for integrating an input signal to output a first integral signal; and
      second integrating circuit, for integrating the first integral signal to output a second integral signal;
   a signal attenuator, coupled to the integrator, for attenuating the second integral signal to output an attenuation signal;
   a switched-capacitor, coupled between the signal attenuator and the integrator, for feeding back the attenuation signal to the integrator;
   wherein the first integrating circuit comprises:
      an operational amplifier, having an input end and an output end;
      an integrating capacitor, having a first end and a second end, the first end of the integrating capacitor is coupled to the input end of the operational amplifier and the second end of the integrating capacitor is coupled to the output end of the operational amplifier;
      a switching circuit, having a first end and a second end, the second end of the switching circuit is coupled to the first end of the integrating capacitor and the input end of the operational amplifier; and
      a second switched-capacitor, having a first end and a second end, the second end of the second switched-capacitor is coupled to the first end of the switching circuit and the first end of the second switched-capacitor is coupled to the input signal, wherein a ratio of a capacitance value of the integrating capacitor and a capacitance value of the switched-capacitor is corresponding to the attenuation signal.

17. The filter according to claim 16, wherein the signal attenuator is implemented by a resistor.

18. The filter according to claim 17, wherein the resistor is a metal resistor, a poly resistor or a well-resistor.

19. The filter according to claim 16, wherein the switched-capacitor is operated according to a plurality of pulse signals with different phase.

20. The filter according to claim 16, wherein the filter is applied in a sigma-delta modulator.

* * * * *